(12) United States Patent
Wen et al.

(10) Patent No.: US 9,027,247 B2
(45) Date of Patent: May 12, 2015

(54) LIQUID ADHESIVE APPLICATION BY CONTACT PRINTING

(71) Applicant: Xerox Corporation, Norwalk, CT (US)

(72) Inventors: Xuejin Wen, Fairport, NY (US); Mark A. Cellura, Webster, NY (US)

(73) Assignee: Xerox Corporation, Norwalk, CT (US)

(*) Notice: Subject to any disclaimer, the term of this patent is extended or adjusted under 35 U.S.C. 154(b) by 281 days.

(21) Appl. No.: 13/657,095

(22) Filed: Oct. 22, 2012

(65) Prior Publication Data

US 2014/0109408 A1    Apr. 24, 2014

(51) Int. Cl.
*B41J 2/16* (2006.01)
*H01L 41/318* (2013.01)

(52) U.S. Cl.
CPC ............. *B41J 2/16* (2013.01); *Y10T 29/49401* (2013.01); *H01L 41/318* (2013.01); *B41J 2/1623* (2013.01); *Y10S 29/001* (2013.01)

(58) Field of Classification Search
CPC .................................................. B41J 2/1623
USPC ............. 29/890.1, DIG. 1, 830; 156/60, 305, 156/235; 427/335
See application file for complete search history.

(56) References Cited

U.S. PATENT DOCUMENTS

| 3,067,056 A | 10/1959 | Remer | |
| 4,316,967 A * | 2/1982 | Hergenrother et al. | 525/111 |
| 4,678,529 A * | 7/1987 | Drake et al. | 156/234 |
| 4,855,333 A * | 8/1989 | Rudik et al. | 522/71 |
| 5,761,809 A * | 6/1998 | Fuller et al. | 29/890.1 |
| 5,762,812 A * | 6/1998 | Narang | 216/27 |
| 5,816,158 A | 10/1998 | Ross | |
| 5,900,892 A * | 5/1999 | Mantell et al. | 347/45 |
| 5,945,253 A * | 8/1999 | Narang et al. | 430/280.1 |
| 6,210,522 B1 * | 4/2001 | Singh et al. | 347/50 |
| 6,732,643 B2 | 5/2004 | Kwon et al. | |
| 7,049,176 B2 | 5/2006 | Oda et al. | |
| 7,761,980 B2 * | 7/2010 | Ota | 29/825 |
| 2002/0115737 A1 * | 8/2002 | Freitag et al. | 521/135 |
| 2003/0140485 A1 | 7/2003 | Yamazaki et al. | |
| 2003/0195268 A1 * | 10/2003 | Freitag et al. | 521/130 |
| 2010/0062570 A1 | 3/2010 | Test | |

* cited by examiner

*Primary Examiner* — Peter DungBa Vo
*Assistant Examiner* — Kaying Kue
(74) *Attorney, Agent, or Firm* — MH2 Technology Law Group LLP

(57) ABSTRACT

A method and structure for forming an ink jet printhead can include the use of a transfer pad to transfer an adhesive solution to an ink jet printhead substrate. The adhesive solution can be placed within a patterned recess of a cliché and then an upper surface of the adhesive solution can be gelled. A surface of the transfer pad contacts the gelled upper surface and transfers the adhesive solution to the ink jet printhead substrate. During the transfer, a lower surface of the adhesive solution gels. During contact with the ink jet printhead substrate, the gelled lower surface adheres to the ink jet printhead substrate while the gelled upper surface releases from the transfer pad.

19 Claims, 5 Drawing Sheets

LIQUID ADHESIVE APPLICATION BY CONTACT PRINTING

FIELD OF THE EMBODIMENTS

The present teachings relate to the field of ink jet printing devices and, more particularly, to methods and structures for forming high density piezoelectric ink jet printheads and a printer including a high density piezoelectric ink jet printhead.

BACKGROUND OF THE EMBODIMENTS

Drop on demand ink jet technology is widely used in the printing industry. Printers using drop on demand ink jet technology can use either thermal ink jet technology or piezoelectric technology. Even though they are more expensive to manufacture than thermal ink jets, piezoelectric ink jets are generally favored, for example because they can use a wider variety of inks.

Piezoelectric ink jet printheads include an array of piezoelectric elements (i.e., transducers or PZTs). One process to form the array can include detachably bonding a blanket piezoelectric layer to a transfer carrier with an adhesive, and dicing the blanket piezoelectric layer to form a plurality of individual piezoelectric elements. A plurality of dicing saw passes can be used to remove all the piezoelectric material between adjacent piezoelectric elements to provide the correct spacing between each piezoelectric element.

Piezoelectric ink jet printheads can typically further include a flexible diaphragm to which the array of piezoelectric elements is attached. When a voltage is applied to a piezoelectric element, typically through electrical connection with an electrode electrically coupled to a power source, the piezoelectric element bends or deflects, causing the diaphragm to flex which expels a quantity of ink from a chamber through a nozzle. The flexing further draws ink into the chamber from a main ink reservoir through an opening to replace the expelled ink.

A printhead can include several layers that form ink channels and other printhead structures. Liquid adhesive such as epoxy can be used to bond two layers together. There are typically two ways of applying liquid adhesives, direct application and through the use of B-stage materials.

Direct application can include such methods as spin-coating, screen printing, and contact printing. Spin-coating can apply a uniform layer of liquid adhesive on top surface, but cannot avoid unwanted area, such as holes. Screen printing is versatile, but may not available for liquid adhesives at low viscosity. Micro-contact printing is appropriate for a very thin layer (a few nanometers or less), targeted at molecular level applications.

B-stage materials are liquid adhesives that have been partially cured to form adhesive films. Developing liquid adhesives into B-stage films can require extensive, time-consuming research efforts.

Additional adhesive methods and structures which can overcome the deficiencies of prior adhesion methods and which can be applied to manufacturing technologies such as printhead manufacture would be desirable.

SUMMARY OF THE EMBODIMENTS

The following presents a simplified summary in order to provide a basic understanding of some aspects of one or more embodiments of the present teachings. This summary is not an extensive overview, nor is it intended to identify key or critical elements of the present teachings nor to delineate the scope of the disclosure. Rather, its primary purpose is merely to present one or more concepts in simplified form as a prelude to the detailed description presented later.

In an embodiment of the present teachings, a method for forming an ink jet printhead can include placing an adhesive solution comprising an adhesive and a solvent into a patterned recess in a cliché, gelling an upper surface of the adhesive solution, and contacting the gelled upper surface of the adhesive solution with a surface of a transfer pad such that the gelled upper surface adheres to the surface of the transfer pad. With the gelled upper surface adhering to the transfer pad, the adhesive solution can be transferred to a position over a substrate wherein, during the transferring of the adhesive solution, the solvent at least partially evaporates from the adhesive solution to form a gelled lower surface of the adhesive solution. The gelled lower surface of the adhesive solution can be contacted with an ink jet printhead substrate, and the transfer pad is lifted away from the ink jet printhead substrate such that the gelled lower surface of the adhesive solution adheres to the ink jet printhead substrate and the gelled upper surface of the adhesive solution releases from the surface of the transfer pad.

In another embodiment of the present teachings, a method for forming an ink jet printer can include forming at least one ink jet printhead using a method including placing an adhesive solution comprising an adhesive and a solvent into a patterned recess in a cliché, gelling an upper surface of the adhesive solution, and contacting the gelled upper surface of the adhesive solution with a surface of a transfer pad such that the gelled upper surface adheres to the surface of the transfer pad. With the gelled upper surface adhering to the transfer pad, the adhesive solution can be transferred to a position over a substrate wherein, during the transferring of the adhesive solution, the solvent at least partially evaporates from the adhesive solution to form a gelled lower surface of the adhesive solution. The gelled lower surface of the adhesive solution can be contacted with an ink jet printhead substrate, and the transfer pad is lifted away from the ink jet printhead substrate such that the gelled lower surface of the adhesive solution adheres to the ink jet printhead substrate and the gelled upper surface of the adhesive solution releases from the surface of the transfer pad. The method for forming the ink jet printer can further include placing the at least one ink jet printhead into a printer housing.

BRIEF DESCRIPTION OF THE DRAWINGS

The accompanying drawings, which are incorporated in and constitute a part of this specification, illustrate embodiments of the present teachings and together with the description, serve to explain the principles of the disclosure. In the figures.

It should be noted that some details of the FIGS. have been simplified and are drawn to facilitate understanding of the present teachings rather than to maintain strict structural accuracy, detail, and scale.

DESCRIPTION OF THE EMBODIMENTS

Reference will now be made in detail to exemplary embodiments of the present teachings, examples of which are illustrated in the accompanying drawings. Wherever possible, the same reference numbers will be used throughout the drawings to refer to the same or like parts.

As used herein, unless otherwise specified, the word "printer" encompasses any apparatus that performs a print outputting function for any purpose, such as a digital copier, bookmaking machine, facsimile machine, a multi-function machine, electrostatographic device, etc. Unless otherwise specified, the word "polymer" encompasses any one of a broad range of carbon-based compounds formed from long-chain molecules including thermoset polyimides, thermoplastics, resins, polycarbonates, epoxies, and related compounds known to the art.

An embodiment of the present teachings can include a method and a related apparatus for applying a liquid adhesive to a printhead layer by using contact printing technology such as pad printing. Pad printing is typically used to print ink onto curved surfaces such as golf balls and syringe barrels. In an embodiment of the present teachings, a silicone transfer pad can be used to transfer a dilute adhesive from one or more recesses within a plate (i.e., a cliché) to a substrate as described in detail below.

FIGS. 1-8 depict an embodiment of the present teachings, which can include a method and structure for forming an ink jet printhead. In this embodiment, a solvent-diluted liquid adhesive solution 10 that can include various qualities as discussed below is placed into a cup 12. The cup 12 is flipped onto a surface of a cliché 14, for example a stainless steel cliché, and, in an embodiment, held against the cliché 14 by magnetic force between the cup 12 and the stainless steel cliché 14. The adhesive solution within the cup 12 fills patterned half-tone recesses 16 within the cliché 14.

Figure 1:
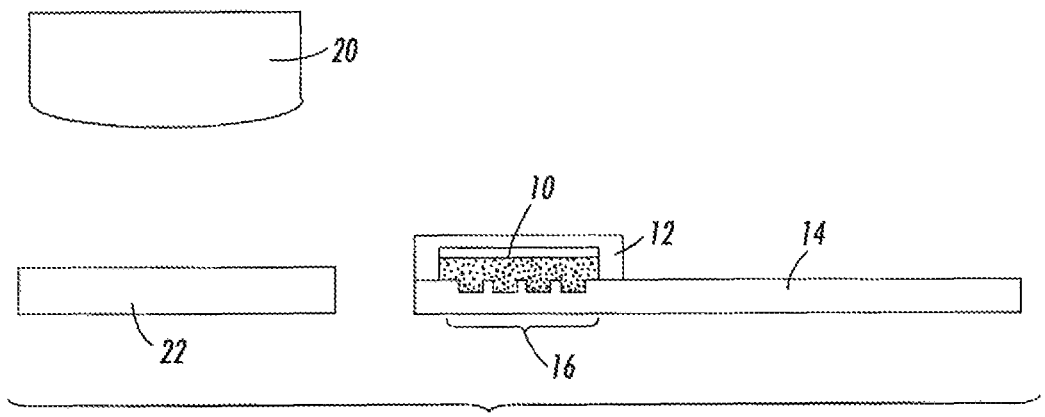
FIGS. 1-8 are cross sections depicting various stages of a process used to for structure such as an ink jet printhead.
Figure 2:
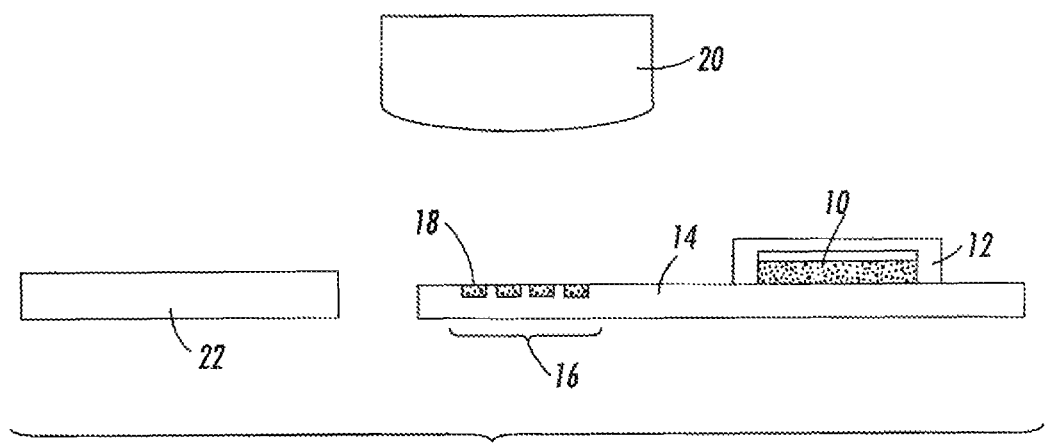

In this embodiment, the cup 12 is slid across the cliché 14 using mechanical or electromechanical techniques to the FIG. 2 position. As the cup 12 slides across the cliché, the adhesive solution is doctored by a trailing inside edge of the cup 12 such that an adhesive solution portion 18 remains within the patterned recesses 16. The solvent used to dilute the adhesive to form the adhesive solution 10 can be selected to have an evaporation temperature that is within the ambient working temperature encountered during processing. As such, when exposed to air as depicted in FIG. 2, the solvent within the exposed adhesive solution 18 begins to evaporate such that the exposed upper surface of the solution 10 changes from a liquid solution with a higher solvent content and a lower adhesive content to gelled state with a lower solvent content and higher adhesive content.

Figure 3:
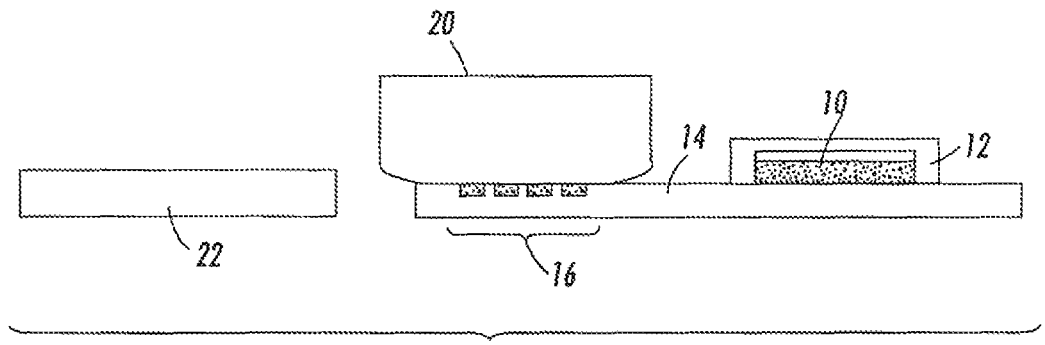
Figure 4:
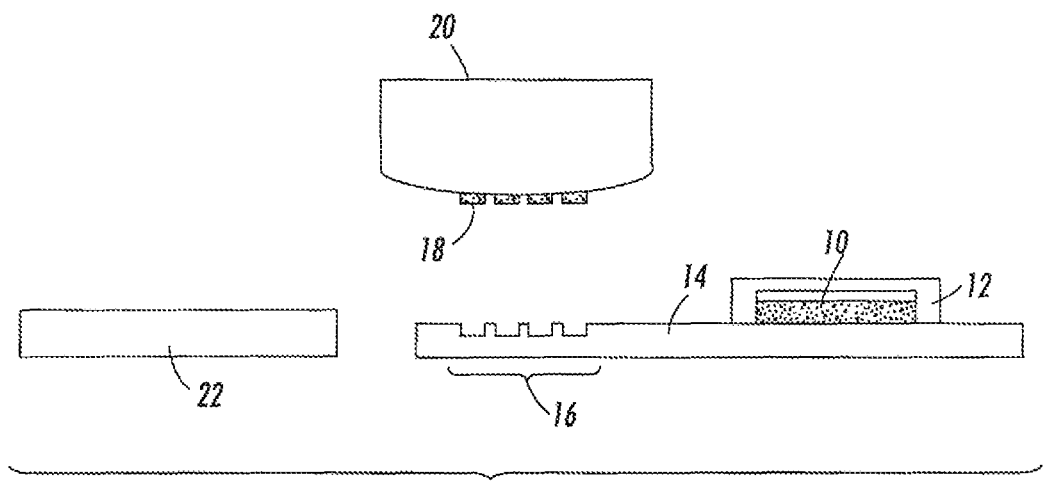
Figure 5:
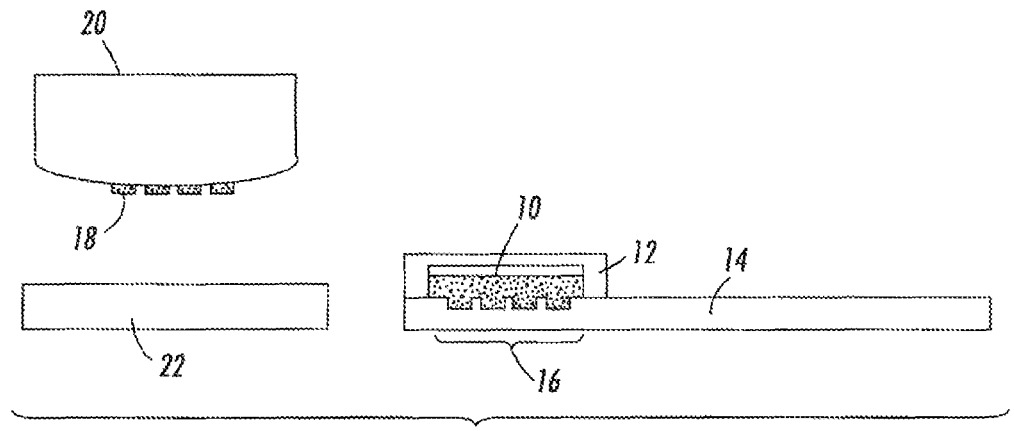

A transfer pad 20, for example a silicon transfer pad which can be part of a press assembly, is moved to physically contact the exposed gelled upper surface of the adhesive solution 18 as depicted in FIG. 3. The tacky gelled upper surface of the adhesive solution 18 adheres to the surface of the transfer pad 20, and the pad 20 is lifted away from the cliché 14 as depicted in FIG. 4. The transfer pad 20 is then moved into the FIG. 5 position over an ink jet printhead substrate 22 to which the adhesive 18 is to be applied. Additionally, the cup 12 can be moved across the surface of the cliché 18 to dispense adhesive solution 10 within the cup 12 into the patterned recess 16 for the next adhesive application. As the transfer pad 20 is moved, the solvent within the adhesive solution 18 further evaporates such that the lower surface of the adhesive 10 becomes gelled and tacky. A time delay can be added if necessary before contacting the substrate 22 with the adhesive 10 to ensure that the solvent within the adhesive 10 is sufficiently gelled.

Figure 6:
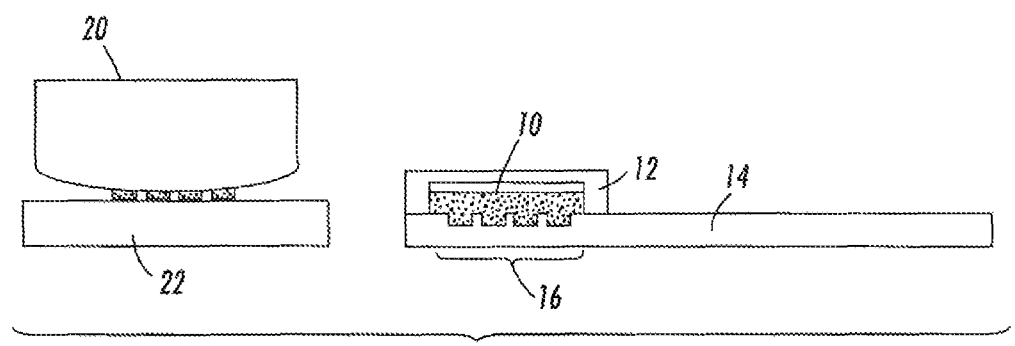
Figure 7:
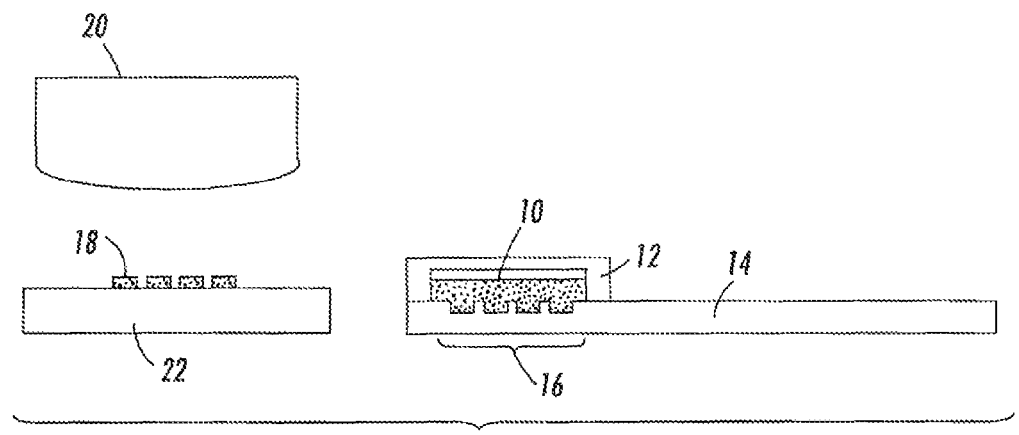

After the lower surface of the adhesive solution 18 is sufficiently gelled, the transfer pad 20 is moved toward the substrate 22 such that the gelled lower surface of the adhesive 18 contacts the substrate 22 as depicted in FIG. 6. The substrate 22 is selected to include a material which has a stronger adhesion to the adhesive 18 than does the material of the pad 20 so that when the pad 20 is moved away from the substrate 22 as depicted in FIG. 7 the gelled lower surface of the adhesive solution 18 adheres to the substrate 22 and the upper surface releases from the surface of the transfer pad 20.

Figure 8:
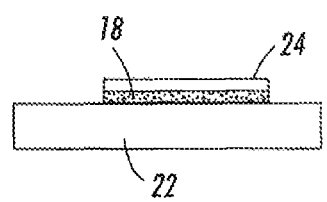

Subsequently, a printhead assembly layer 24 can be contacted with the adhesive 18 under sufficient pressure to distribute the adhesive 18 between the substrate 22 and the assembly layer 24 as depicted in FIG. 8 and to form an adhesive layer having a uniform thickness. Subsequently, an appropriate adhesive curing process, such as a temperature or UV cure, can be performed to adhere the assembly layer 24 to the substrate 22 with the adhesive 18.

As discussed above, the adhesive solution 10 can include an adhesive dissolved in a solvent to decrease viscosity such that the adhesive solution 10 readily flows into the recesses 16. The adhesive and solvent can be selected to have the properties discussed above. For example, a solvent with an evaporation point that is within the ambient working temperature of the process can be selected. An adhesive which forms a stronger bond with a material of the substrate 22, such as stainless steel or polyimide, than with the material of the transfer pad 20, such as silicone (which has a lower surface energy than the material of the substrate, such as stainless steel), can also be selected. In an embodiment for forming an ink jet printhead, the adhesive can be selected for compatibility with various inks, as the layers which are adhered together can form an ink channel. In one embodiment, the adhesive can include SU2.5 and/or EPON™ Resin 154, both available from Momentive Specialty Chemicals Inc. Other liquid adhesives that may be sufficient for an implementation of the present teachings include GY6010 and EPN1139, available from Huntsman LLC and I2300, available from Resin Designs LLC. The adhesive solution can include various diluting solvents, such as methylene chloride ($CCl_2H_2$), available from Dow Chemical Company, which has a boiling point of about 40° C. In an embodiment, the starting adhesive solution can include between about 25% to about 75% by volume of adhesive with about 75% to about 25% by volume of solvent, or about 50% adhesive and about 50% solvent. The viscosity of the adhesive solution is inversely proportional to the % of solvent.

In a embodiment, a single adhesive application may not provide a sufficiently thick layer of adhesive on the substrate. The process described above relative to FIGS. 1-7 can be repeated at the same location on a substrate 22 to form a sufficiently thick adhesive layer over several adhesive applications.

Figure 9:
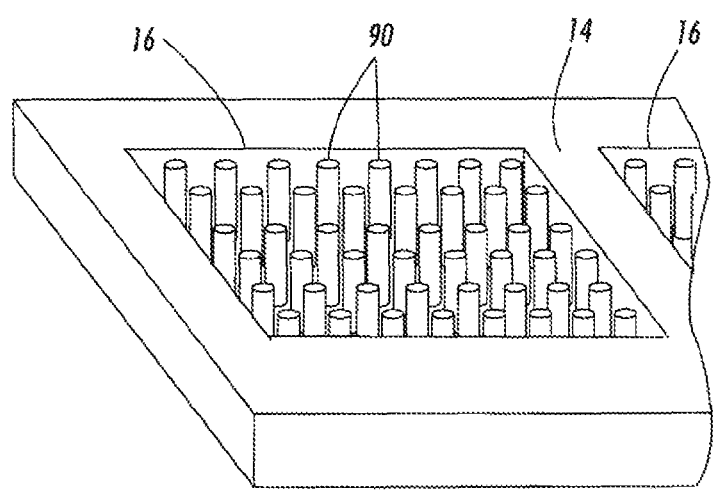
FIG. 9 is a magnified perspective view of part of a cliché which can be used in an embodiment of the present teachings.

FIG. 9 is a magnified perspective view of a cliché 14 including patterned recesses 16 according to an embodiment of the present teachings. It should be noted that FIG. 9 is depicted to facilitate understanding of the present teachings and not to maintain strict structural scale. FIG. 9 further depicts a plurality of half-tone posts 90 within each patterned recess 16. In some uses, the half tone posts 90 can improve the uniformity of the layer of adhesive 18 placed on the substrate 22 through a more even distribution of the adhesive 18 across the substrate 22 more compared to a cliché without the half-tone posts 90. As the transfer pad contacts the gelled upper surface of the adhesive solution within the patterned recess of the cliché, the surface of the transfer pad contacts the upper surface of the half-tone posts to help to evenly distribute the adhesive solution across the surface of the transfer pad. In addition, the posts 90 can help to ensure that the adhesive is not deposited within holes, channels, or channel openings in the substrate 22, thereby decreasing contamination with the adhesive in unwanted areas.

In an embodiment, the recess 16 within the cliché 14 can be etched to a depth of between about 15 micrometers (μm) and about 35 μm, or between about 20 μm and about 30 μm, or about 25 μm. Similarly, the posts 90 will have a height of between about 15 micrometers (μm) and about 35 μm, or between about 20 μm and about 30 μm, or about 25 μm. The width or diameter of the posts can be between about 25 μm and about 75 μm, or between, about 25 μm and about 50 μm, or between about 30 μm and about 60 μm, or about 50 μm. Forming recesses which are excessively deep and posts which are excessively tall can result in a liquid adhesive film that is too thick for the pad to pick up. Forming recesses which are excessively shallow and posts which are excessively short can result in a quantity of liquid adhesive that is insufficient to bond surfaces together or provides weak bonds.

The process and structure described above can be tailored as necessary for individual substrate designs. For example, a substrate such as a metal or polymer mesh found with, for example, printhead particulate filters, bodies, and manifolds, can include void areas which are larger than the mesh material itself, in contrast to a mostly solid surface of other printhead layers. When the size of voids (for example, 50 μm) in the adhesive solution from the half-tone posts is comparable to or larger than the width of the web in the meshes, the adhesive may not be formed to sufficiently cover the web material to provide a solid bonding and sealing. In these instances, the viscosity of the liquid adhesive can be decreased so that the adhesive solution flows to sufficiently cover the mesh material before the solvent evaporates. For example, for solid surfaces, the adhesive solution can have a starting viscosity of between about 0.001 pascal second (Pa·s) and about 10 Pa·s as it is placed into the patterned recess 16. For a mesh application, the adhesive solution can have a starting viscosity of between about 0.001 Pa·s and about 10 Pa·s as it is placed into the patterned recess 16.

In another embodiment, the material of the transfer pad can be selected for the particular substrate design. In some embodiments, a soft, flexible transfer pad is desired so that it deforms under pressure to cover an uneven surface with adhesive. In other uses, a pad which is excessively compliant to surface topography may deposit onto unwanted areas. An excessively compliant transfer pad can also result in undesirable adhesive voids around the edges of openings as the transfer pad "pinches" the adhesive as the pad deflects into the opening. In other words, at the edge of a hole, the pressure on the pad can be too high such that, at the edge of the opening, the transfer pad squeezes the adhesive away from the opening, which results in a void in the adhesive in the proximity of that opening. These problems can be reduced or eliminated by using a high durometer transfer pad, such as a high durometer silicone transfer pad, or by reducing the stamping pressure to the transfer pad during the application of the adhesive to the substrate.

Thus with a process and structure according to the present teachings, pad printing can be used to apply a uniform layer of an adhesive solution onto an exposed substrate surface. This method and structure can result in good adhesive application in desired areas, with reduced adhesive application in areas where adhesive application is not wanted. The adhesive application can result in adhesion between a stainless steel substrate and a polyimide assembly layer which is sufficient to withstand a 10 PSI leakage test which is appropriate for printhead fabrication.

The adhesive application process can be performed more quickly than other adhesive application methods, such as screen printing, spin coating, and the use of B-stage films. In one embodiment, one cycle of operation from an application of the adhesive solution to the transfer pad, to the application of the adhesive to the substrate, and the re-application of adhesive to the transfer pad, can be less than about 10 seconds, for example about 3 seconds. As discussed above, the process and structure may be tailored for many liquid adhesives and substrate shapes and textures (plain surfaces, meshes with different web widths, uneven surfaces, etc.).

Additionally, in contrast to the application of film adhesives, the application of a liquid adhesive according to the present teachings is a process which self-aligns the liquid adhesive to openings, recesses, and other non-planar topography within a substrate. In other words, a low-tolerance alignment of the liquid adhesive to the functional printhead layers is not required, as the liquid adhesive process self-aligns the adhesive to the substrate features. Aligning a film adhesive to functional printhead layers can be challenging, particularly with higher resolution printheads.

Figure 10:
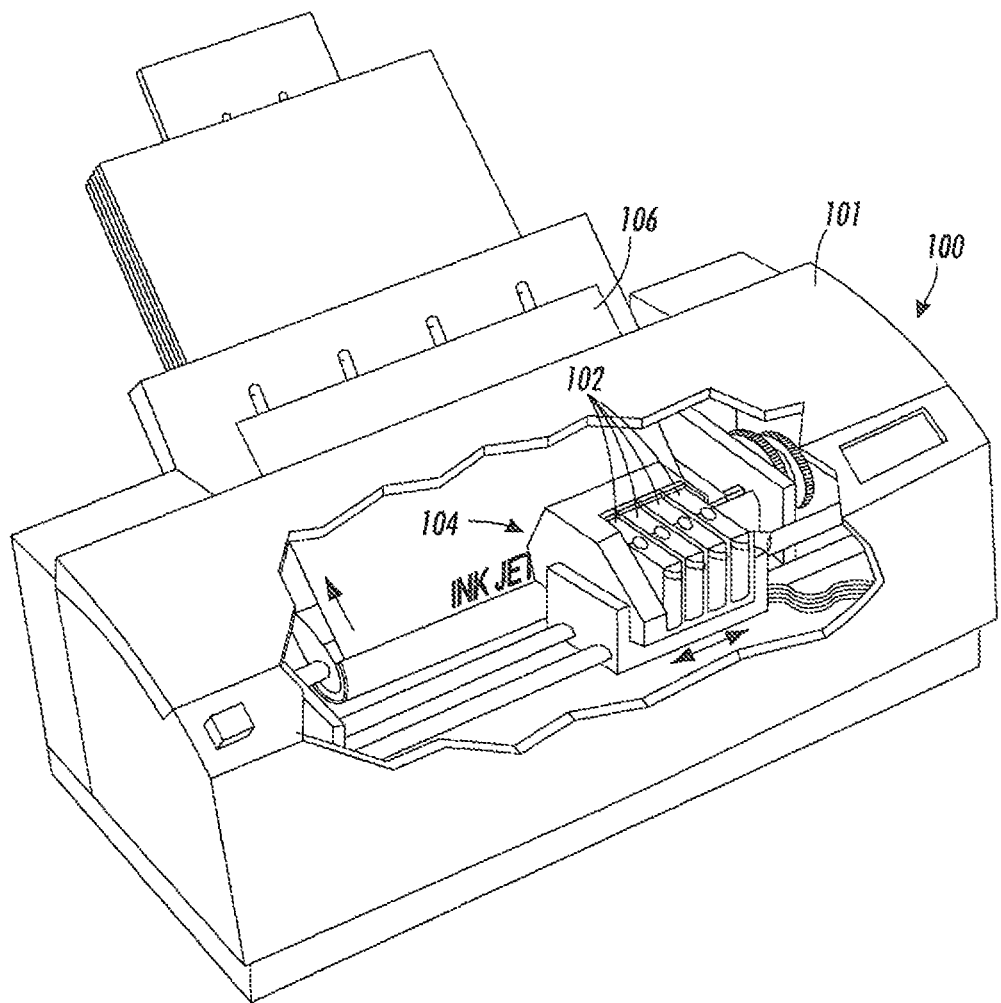
FIG. 10 is a perspective view of a printer which can be formed using one or more printheads in accordance with an embodiment of the present teachings.

FIG. 10 depicts a printer 100 including a printer housing 101 into which at least one printhead 102 formed using the methods and structures of the present teachings has been installed. During operation, ink 104 is ejected from one or more printheads 102. Each printhead 92 is operated in accordance with digital instructions to create a desired image on a print medium 106 such as a paper sheet, plastic, etc. The printhead 102 may move back and forth relative to the print medium 106 in a scanning motion to generate the printed image swath by swath. Alternately, the printhead 102 may be held fixed and the print medium 106 moved relative to it, creating an image as wide as the printhead 102 in a single pass. The printhead 102 can be narrower than, or as wide as, the print medium 106. In another embodiment, the printhead 102 can print to an intermediate surface such as a rotating drum or belt (not depicted for simplicity) for subsequent transfer to a print medium.

Notwithstanding that the numerical ranges and parameters setting forth the broad scope of the present teachings are approximations, the numerical values set forth in the specific examples are reported as precisely as possible. Any numerical value, however, inherently contains certain errors necessarily resulting from the standard deviation found in their respective testing measurements. Moreover, all ranges disclosed herein are to be understood to encompass any and all sub-ranges subsumed therein. For example, a range of "less than 10" can include any and all sub-ranges between (and including) the minimum value of zero and the maximum value of 10, that is, any and all sub-ranges having a minimum value of equal to or greater than zero and a maximum value of equal to or less than 10, e.g., 1 to 5. In certain cases, the numerical values as stated for the parameter can take on negative values. In this case, the example value of range stated, as "less than 10" can assume negative values, e.g. −1, −2, −3, −10, −20, −30, etc.

While the present teachings have been illustrated with respect to one or more implementations, alterations and/or modifications can be made to the illustrated examples without departing from the spirit and scope of the appended claims. For example, it will be appreciated that while the process is described as a series of acts or events, the present teachings are not limited by the ordering of such acts or events. Some acts may occur in different orders and/or concurrently with other acts or events apart from those described herein. Also, not all process stages may be required to implement a methodology in accordance with one or more aspects or embodiments of the present teachings. It will be appreciated that structural components and/or processing stages can be added or existing structural components and/or processing stages can be removed or modified. Further, one or more of the acts depicted herein may be carried out in one or more separate acts and/or phases. Furthermore, to the extent that the terms "including," "includes," "having," "has," "with," or variants thereof are used in either the detailed description and the claims, such terms are intended to be inclusive in a manner similar to the term "comprising." The term "at least one of" is used to mean one or more of the listed items can be selected. Further, in the discussion and claims herein, the term "on" used with respect to two materials, one "on" the other, means at least some contact between the materials, while "over" means the materials are in proximity, but possibly with one or more additional intervening materials such that contact is possible but not required. Neither "on" nor "over" implies any directionality as used herein. The term "conformal" describes a coating material in which angles of the underlying material are preserved by the conformal material. The term "about" indicates that the value listed may be somewhat altered, as long as the alteration does not result in nonconformance of the process or structure to the illustrated embodiment. Finally, "exemplary" indicates the description is used as an example, rather than implying that it is an ideal. Other embodiments of the present teachings will be apparent to those skilled in the art from consideration of the specification and practice of the disclosure herein. It is intended that the specification and examples be considered as exemplary only, with a true scope and spirit of the present teachings being indicated by the following claims.

Terms of relative position as used in this application are defined based on a plane parallel to the conventional plane or working surface of a workpiece, regardless of the orientation of the workpiece. The term "horizontal" or "lateral" as used in this application is defined as a plane parallel to the conventional plane or working surface of a workpiece, regardless of the orientation of the workpiece. The term "vertical" refers to a direction perpendicular to the horizontal. Terms such as "on," "side" (as "sidewall"), "higher," "lower," "over," "top," and "under" are defined with respect to the conventional plane or working surface being on the top surface of the workpiece, regardless of the orientation of the workpiece.

The invention claimed is:

1. A method for forming an ink jet printhead, comprising:
placing an adhesive solution comprising an adhesive and a solvent into a patterned recess in a cliché;
gelling an upper surface of the adhesive solution;
contacting the gelled upper surface of the adhesive solution and a plurality of half-tone posts within the patterned recess of the cliché with a surface of a transfer pad such that the gelled upper surface adheres to the surface of the transfer pad, wherein the plurality of half-tone posts have a height of between about 15 µm and about 35 µm and a width or diameter of between about 25 µm and about 50 µm;
with the gelled upper surface adhering to the transfer pad, transferring the adhesive solution to a position over a substrate wherein, during the transferring of the adhesive solution, the solvent at least partially evaporates from the adhesive solution to form a gelled lower surface of the adhesive solution;
contacting the gelled lower surface of the adhesive solution with an ink jet printhead substrate; and
lifting the transfer pad away from the ink jet printhead substrate such that the gelled lower surface of the adhesive solution adheres to the ink jet printhead substrate and the gelled upper surface of the adhesive solution releases from the surface of the transfer pad.

2. The method of claim 1, wherein the adhesive within the adhesive solution placed within the patterned recess in the cliché comprises a material selected from the group consisting of SU2.5, EPON Resin 154, GY6010, EPN1139, I2300, and mixtures thereof.

3. The method of claim 2, wherein the solvent within the adhesive solution placed within the patterned recess in the cliché comprises methylene chloride.

4. The method of claim 1, wherein the solvent within the adhesive solution placed within the patterned recess in the cliché comprises methylene chloride.

5. The method of claim 1, further comprising:
contacting the gelled upper surface of the adhesive layer with an ink jet printhead assembly layer while the gelled lower surface of the adhesive solution contacts the ink jet printhead substrate; and
curing the adhesive solution to bond the ink jet printhead substrate to the ink jet printhead assembly layer.

6. The method of claim 1, wherein the plurality of half-tone posts within the patterned recess of the cliché self-aligns the adhesive during contact of the gelled lower surface of the adhesive solution with the ink jet printhead.

7. The method of claim 1, wherein the surface of the transfer pad comprises silicone and the ink jet printhead substrate comprises stainless steel.

8. The method of claim 1, wherein the adhesive solution has a viscosity of between about 0.001 Pa·s and about 10 Pa·s as it is placed into the patterned recess in the cliché.

9. The method of claim 1, further comprising:
placing the adhesive solution within a cup;
placing the adhesive solution within the cup over the patterned recess; and
sliding the cup across a surface of the cliché to doctor the adhesive solution with a trailing inside edge of the cup such that the adhesive solution remains within the patterned recess.

10. The method of claim 1, wherein the adhesive within the adhesive solution placed within the patterned recess in the cliché comprises a material selected from the group consisting of SU2.5, EPON Resin 154, GY6010, EPN1139, I2300, and mixtures thereof.

11. A method for forming an ink jet printhead, comprising:
placing an adhesive solution comprising an adhesive and a solvent within a cup;
placing the adhesive solution within the cup over a patterned recess in a cliché;
sliding the cup across a surface of the cliché to doctor the adhesive solution with a trailing inside edge of the cup such that the adhesive solution remains within the patterned recess in the cliché;
gelling an upper surface of the adhesive solution;
contacting the gelled upper surface of the adhesive solution with a surface of a transfer pad such that the gelled upper surface adheres to the surface of the transfer pad;
with the gelled upper surface adhering to the transfer pad, transferring the adhesive solution to a position over a substrate wherein, during the transferring of the adhesive solution, the solvent at least partially evaporates from the adhesive solution to form a gelled lower surface of the adhesive solution;
contacting the gelled lower surface of the adhesive solution with an ink jet printhead substrate; and
lifting the transfer pad away from the ink jet printhead substrate such that the gelled lower surface of the adhesive solution adheres to the ink jet printhead substrate and the gelled upper surface of the adhesive solution releases from the surface of the transfer pad.

12. The method of claim 11, wherein the adhesive within the adhesive solution placed within the patterned recess in the cliché comprises a material selected from the group consisting of SU2.5, EPON Resin 154, GY6010, EPN1139, I2300, and mixtures thereof.

13. The method of claim 12, wherein the solvent within the adhesive solution placed within the patterned recess in the cliché comprises methylene chloride.

14. The method of claim 11, wherein the solvent within the adhesive solution placed within the patterned recess in the cliché comprises methylene chloride.

15. The method of claim 11, further comprising:
contacting the gelled upper surface of the adhesive layer with an ink jet printhead assembly layer while the gelled lower surface of the adhesive solution contacts the ink jet printhead substrate; and
curing the adhesive solution to bond the ink jet printhead substrate to the ink jet printhead assembly layer.

16. The method of claim 11, further comprising contacting a plurality of half-tone posts within the patterned recess of the cliché with the surface of the transfer pad during the contacting of the gelled upper surface of the adhesive solution with the surface of the transfer pad.

17. The method of claim 16, wherein the plurality of half-tone posts within the patterned recess of the cliché self-aligns the adhesive during contact of the gelled lower surface of the adhesive solution with the ink jet printhead.

18. The method of claim 11, wherein the surface of the transfer pad comprises silicone and the ink jet printhead substrate comprises stainless steel.

19. The method of claim 11, wherein the adhesive solution has a viscosity of between about 0.001 Pa·s and about 10 Pa·s as it is placed into the patterned recess in the cliché.

* * * * *